United States Patent [19]

Musa et al.

[11] 4,224,539

[45] Sep. 23, 1980

[54] FET VOLTAGE LEVEL DETECTING CIRCUIT

[75] Inventors: Fuad H. Musa; Pern Shaw, both of Austin, Tex.

[73] Assignee: Motorola, Inc., Schaumburg, Ill.

[21] Appl. No.: 939,725

[22] Filed: Sep. 5, 1978

[51] Int. Cl.$^2$ ............... H03K 5/20; H03K 17/30; H03K 1/12

[52] U.S. Cl. .................... 307/362; 307/297; 307/364; 323/22 R; 340/636

[58] Field of Search ............ 307/200 B, 297, 304, 307/360, 361, 362, 363, 364; 58/23 BA, 152 H; 323/1, 4, 22 R; 340/636, 661, 662, 663

[56] References Cited

U.S. PATENT DOCUMENTS

| | | | |
|---|---|---|---|
| 3,508,084 | 4/1970 | Warner, Jr. | 323/22 R X |
| 3,733,498 | 5/1973 | Watson | 307/350 X |
| 3,815,354 | 6/1974 | Strocka | 323/1 X |
| 3,877,001 | 4/1975 | Bogut et al. | 340/636 |
| 3,913,026 | 10/1975 | Koehler | 323/22 R X |
| 3,975,649 | 8/1976 | Kawagoe et al. | 323/22 R X |
| 4,024,415 | 5/1977 | Matsuura | 307/362 |
| 4,048,524 | 9/1977 | Laugesen et al. | 307/360 X |
| 4,096,430 | 6/1978 | Waldron | 323/22 R |
| 4,100,437 | 7/1978 | Hoff, Jr. | 323/22 R X |
| 4,140,930 | 2/1979 | Tanaka | 307/362 |

FOREIGN PATENT DOCUMENTS 2732511  1/1978  Fed. Rep. of Germany ........ 323/22 R

OTHER PUBLICATIONS

Richman, *Characteristics and Operation of MOS Field-Effect Devices*, pp. 114-118; McGraw-Hill Book Co., 1967.

*Primary Examiner*—Larry N. Anagnos
*Attorney, Agent, or Firm*—Joe E. Barbee

[57] ABSTRACT

There is provided a voltage level detecting circuit useful as power-up/power-down voltage indicator for a field effect transistor integrated circuit. A constant voltage reference generator is provided by a depletion type transistor in series with two enhancement type transistors coupled between power supply terminals of the integrated circuit chip. Each of the enhancement type transistors have their gate electrodes connected to their drain electrodes while the depletion type transistor has its gate electrode connected to the more negative or reference terminal of the power supply voltage. A constant voltage output is taken from between the junction of one of the enhancement mode transistors and the depletion type transistor. This constant voltage output can be compared against a voltage obtained from a voltage divider circuit which provides an output that varies in accordance with variations in the power supply. The voltage level detector circuit is particularly useful in microprocessors and microcomputer integrated circuit chips.

11 Claims, 4 Drawing Figures

FET VOLTAGE LEVEL DETECTING CIRCUIT

BACKGROUND OF THE INVENTION

This invention relates, in general, to voltage level detecting circuits, and more particularly, to a field effect transistor voltage level detector having a constant voltage reference.

Field effect transistors (FET) are finding wide use particularly in monolithic integrated circuits. It is often desirable to monitor power supply voltage changes on a monolithic integrated circuit particularly a microcomputer unit. Technology has advanced to a point to where a complete microprocessor along with a random access memory can all be integrated onto one silicon chip and it would be highly desirable to have an on-chip monitoring circuit for detecting the level of the power supply voltage. In the past, external logic and voltage comparators were used to monitor power supply voltage and to provide control signals for the monolithic integrated circuit having a minicomputer.

Accordingly, it is an object of the present invention to provide a constant voltage reference for a voltage level detector circuit.

Yet another object of the present invention is to provide an on-chip voltage level detector suitable for use on a monolithic integrated circuit having a microcomputer unit.

SUMMARY OF THE INVENTION

In carrying out the above and other objects of the invention in one form, there is provided a voltage level detector capable of being made as a monolithic integrated circuit and having a constant voltage reference generator. The constant voltage reference generator has at least three field effect transistors connected in series wherein the first transistor is a depletion device and the second and third transistors are enhancement devices having their gate electrodes connected to their drain electrodes. An output of the constant voltage reference generator is provided by a junction formed by the transistors. Also provided is a power supply voltage sensor having a plurality of resistance means coupled between the terminals of the power supply. The constant voltage reference generator provides a constant voltage which does not vary with variations of the power supply voltage while the power supply voltage sensor varies in relation to the variations of the power supply. Outputs of the constant voltage reference generator and the power supply voltage sensor can be coupled to a comparator so that the comparator will provide an output whenever the voltage sensed by the power supply voltage sensor reaches a predetermined level.

DESCRIPTION OF THE PREFERRED EMBODIMENT

Figure 1:
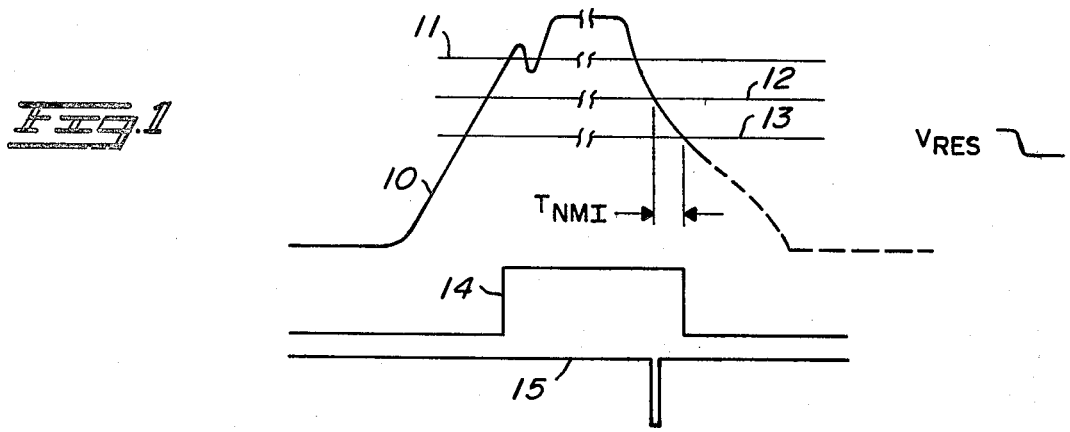
FIG. 1 is a graphical representation of a voltage level being applied to an integrated circuit showing levels at which certain pulses can be generated.

Referring first to FIG. 1, curve 10 represents voltage being applied to a monolithic integrated circuit chip such as a microcomputer unit. When the voltage represented by curve 10 reaches a level equal to line 11 it is desirable to produce a pulse such as a reset pulse 14 thereby indicating that the voltage applied to the integrated circuit is at a satisfactory level. As a rising voltage reaches level 11 it is possible for noise or some external interference to cause the rising voltage curve 10 to cross level 11 more than once. To prevent several reset pulses 14 from being generated preferably some hysteresis is provided.

When power is removed either purposely or accidently a power fail signal (VNMI) 15 can be generated when the decreasing voltage reaches level 12 to in turn generate a non-maskable interrupt (NMI) signal. The NMI signal can be used in a microcomputer unit so that the microcomputer unit can take the necessary steps to prevent the loss of critical data. The non-maskable interrupt signal can also be used to warn the system of a power supply voltage drop. As the power supply voltage continues to drop and reaches a level 13 a reset off ($V_{RES}$) signal can be generated to turn off the integrated circuit. The time between the decreasing power supply voltage crossing level 12 and level 13, and indicated in the drawing as $T_{NMI}$, should be sufficient to allow the microcomputer unit to execute the non-maskable interrupt.

Figure 2:
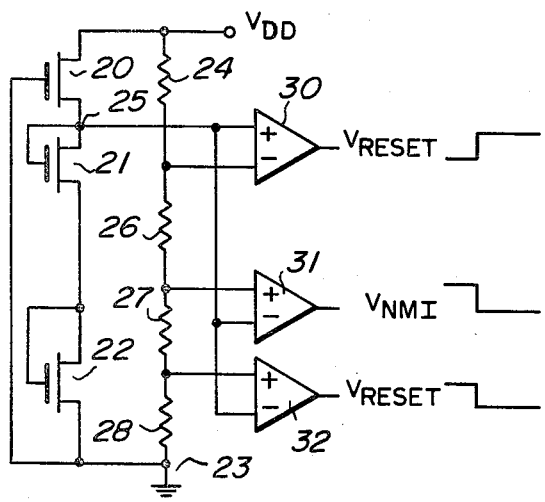
FIG. 2 is a power-up/power-down voltage detector suitable for providing the outputs indicated in FIG. 1.

FIG. 2 illustrates a power-up/power-down voltage level detector suitable for obtaining the output pulses illustrated in FIG. 1. Field effect transistor 20 is a depletion device having its drain connected to a voltage supply terminal $V_{DD}$ and having its gate electrode connected to a second voltage power supply terminal 23. Power supply terminal 23 is illustrated as being a ground or reference point since for purposes of illustration all the transistors used herein are assumed to be N-channel field effect transistors. The source electrode of field effect transistor 20 is connected to node 25. Field effect transistors 21 and 22 are enhancement devices connected in series between node 25 and power supply terminal 23. Transistors 21 and 22 each have their gate electrodes connected to their drain electrodes. The source electrode of transistor 21 is connected to the drain electrode of transistor 22 while the source electrode of transistor 22 is connected to terminal 23. Transistors 20, 21, and 22 form a constant voltage reference generator which provides a constant voltage at output node 25. Once the power supply voltage applied to terminals $V_{DD}$ and 23 exceeds a certain level the voltage appearing at node 25 remains constant even though the power supply voltage continues to rise.

Resistors 24, 26, 27, and 28 are all connected in series between power supply terminals $V_{DD}$ and 23. Resistors 24, 26, 27, and 28 serve as resistance means to provide a voltage divider having three different levels of outputs. The highest level output is connected to an input of a comparator 30. The other input of voltage comparator 30 is connected to node 25. Comparator 30 provides an output V reset which indicates when the power supply voltage $V_{DD}$ reaches a predetermined minimum voltage which is considered satisfactory for circuit operation. A second output from the power supply voltage sensor is taken from the junction of resistors 26 and 27 and coupled to an input of a voltage comparator 31. A second input of voltage comparator 31 is connected to reference output node 25. The output of comparator 31 provides a signal V NMI which would indicate a level of voltage at which a power fail condition exists and the integrated circuit should be providing for power shutdown. A third output from the power supply voltage sensor is taken from the junction of resistors 27 and 28 and is coupled to an input of a voltage comparator 32. The second input of voltage comparator 32 is connected to output reference node 25. The output of voltage comparator 32 provides $V_{RESET}$ which indicates power off as far as the circuit is concerned.

It should be noted that the outputs of voltage comparators 30, 31 and 32 all occur at different voltage levels of the power supply voltage appearing at terminal $V_{DD}$. In the circuit of FIG. 2 the constant voltage reference generator provided by field effect transistors 20, 21 and 22 provides a constant voltage output which is connected to each of the inputs of comparators 30, 31 and 32. A second input to each of the comparators is provided by the power supply voltage sensor formed by resistors 24, 26, 27 and 28. The output voltages provided by the power supply voltage sensor of course will vary as the voltage applied to terminal $V_{DD}$ varies. Output reference node 25 is connected to the non-inverting input of voltage comparator 30 to provide a positive going output when voltage $V_{DD}$ reaches a desired level, while node 25 is coupled to the inverting inputs of voltage comparators 31 and 32 to provide negative going output signals at predetermined voltage levels.

Figure 3:
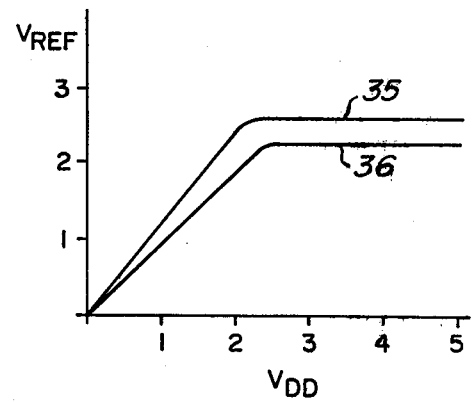
FIG. 3 is a typical curve of the output voltage provided by the constant voltage reference of FIG. 2.

FIG. 3 is a graph showing the output voltage at node 25 of FIG. 2. The voltage $V_{REF}$ appearing at node 25 is plotted along the ordinate while the voltage $V_{DD}$ is plotted along the abscissa. As the voltage $V_{DD}$ increases, the voltage appearing at node 25 increases also following generally between lines 35 and 36 until voltage $V_{DD}$ reaches approximately 2.4 volts at which time voltage $V_{REF}$ at node 25 assumes a constant level. As can be seen, once voltage $V_{DD}$ reaches a level sufficient to saturate transistors 20, 21 and 22 the constant voltage reference generator then provides a constant voltage output. The constant voltage output illustrated by line 36 is approximately 2.2 volts while the constant voltage output illustrated by line 35 is approximately 2.64 volts. Lines 35 and 36 represent what might be expected to be the worst case voltage variations at node 25 due to circuit parameter variations. If the reference voltage were to be obtained from between the two enhancement type transistors 21, 22 then of course, the voltage reference output would have a lower value.

The voltage $V_{REF}$ obtainable at node 25 in FIG. 2 can be calculated by the following equation:

$$V_{REF} = \frac{\left(\sqrt{\frac{K_{20}}{K_{22}}} + \sqrt{\frac{K_{20}}{K_{21}}}\right)|V_{TD}| + 2V_{TE} + \Delta V_{SB}}{1 + \sqrt{\frac{K_{20}}{K_{22}}} + \sqrt{\frac{K_{20}}{K_{21}}}}$$

wherein $K_{20}$, $K_{21}$, and $K_{22}$ are constants of field effect transistors 20, 21 and 22 respectively. The constant K is equal to the device width divided by device length. $V_{TD}$ is the threshold voltage of depletion transistor 20, $V_{TE}$ is the threshold voltage of enhancement transistors 21 and 22; and $\Delta V_{SB}$ is the enhancement threshold voltage increase of transistor 21 due to the substrate bias. It should be noted that in the above equation, mobility and oxide capacitances cancel out, and therefore variation of these parameters due to process variations will not effect the reference voltage.

Figure 4:
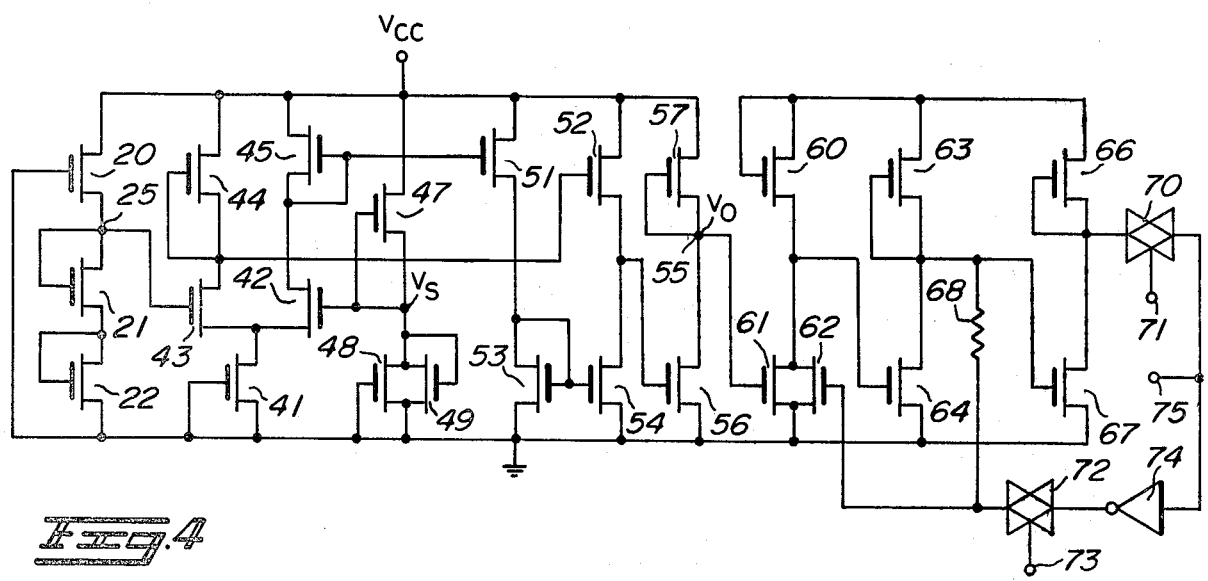
FIG. 4 illustrates a circuit capable of being integrated onto a monolithic integrated circuit having a microcomputer unit.

In FIG. 4 the constant voltage reference generator, comparator, and the power supply voltage sensor are used in a configuration to provide a valid RAM data indicator wherein all of the circuitry of FIG. 4 is integrated on the same silicon chip as is a microcomputer unit. Field effect transistors 20, 21, and 22 form the constant voltage reference generator as in FIG. 2. The power supply voltage sensor is formed by depletion type field effect transistors 47 and 48. Transistors 47 and 48 are connected in a manner to act as resistances and thereby perform the function of a voltage divider. A junction $V_S$ between transistors 47 and 48 provides an output for the power supply voltage sensor. Depletion type transistor 48 is in parallel with an enhancement type transistor 49. Transistor 49 has its gate electrode connected to its drain electrode. Each of the depletion devices 47 and 48 have their gate electrodes connected to their source electrodes. The purpose of transistor 49 is to provide threshold voltage compensation. If due to the process variations the threshold voltage of the depletion devices should vary from a desired value the threshold voltage of the enhancement device will vary in an opposite direction and thereby compensate for the variation. This tends to insure that the voltage $V_S$ is at the right value to provide a valid RAM data indicator at the desired voltage level.

Transistors 41 through 45 are connected in a differential amplifier configuration to perform the function of a voltage comparator. The gate electrode of transistor 43 is connected to node 25 which provides the reference voltage. Series connected transistors 43 and 44 are connected between voltage supply rail $V_{CC}$ and the drain of transistor 41. Series connected transistors 42 and 45 are in parallel with transistors 43 and 44. Transistor 41 serves as a constant current source. The second input, $V_S$, to the voltage comparator is connected to the gate electrode of transistor 42.

Transistors 51 through 54 serve the function of a voltage level shifter. Transistors 53 and 54 are connected in a current mirror configuration while transistors 51 and 52 serve as input transistors for the voltage level shifter. The gate electrode of transistor 52 is connected to a junction formed by transistors 43 and 44 while the gate electrode of transistor 51 is connected to a junction formed by transistors 42 and 45. An output of the voltage level shifter is connected to the gate electrode of transistor 56. Transistor 56 is connected in series with depletion type transistor 57. Transistors 56 and 57 form a high gain output amplifier and provide an output $V_0$ at node 55. The output $V_0$ is used in a circuit which provides a valid RAM data indicator function. Transistors 60, 61 and 62 form a logic NOR circuit whose output is amplified by transistors 63 and 64. The output of transistors 63 and 64 is again amplified by transistors 66 and 67. The output of transistors 66 and 67 is coupled by transmission gate 70 to terminal 75. Terminal 75 is connected to the microcomputer unit data bus. Transmission gate 70 is controlled by a microcomputer unit read control signal applied to terminal 71. The output of transmission gate 70 is coupled by an inverter 74 to transmission gate 72. Transmission gate 72 has an output which is connected to the gate electrode of transistor 62 and coupled by resistor 68 to the gate electrode of transistor 67. Transmission gate 72 is controlled by microcomputer unit write control signal applied to terminal 73.

Terminal 75 is an output for the valid RAM data indicator circuit and is directly connected to the microcomputer unit data bus. The valid RAM data indicator circuit is initially reset for a logic "0" when power is first applied to the integrated circuit chip. When the microcomputer stores valid information into its random access memory (RAM) it writes a logic "1" into the valid RAM data indicator circuit. The circuit will stay in the logic "1" state as long as the power supply voltage is above a minimum predetermined level. However, when the power supply voltage drops below the minimum predetermined level, voltage $V_0$ will cause the valid data RAM indicator circuit to reset to a logic "0". The logic "0" state indicates that the power supply voltage has dropped below its minimum predetermined level and the RAM data may not be valid. The indicator circuit will remain in the logic "0" state until the microcomputer again writes a logic "1" into it.

By now it should be appreciated that there has been provided a constant voltage reference generator which remains at a constant value even when its power supply voltage level drops. The constant voltage reference generator serves a function similar to a zener diode but yet uses field effect transistors. The constant voltage reference generator is used in a voltage level detector circuit which can all be integrated onto a field effect transistor integrated circuit.

The constant voltage reference generator has been illustrated as useful in generating a power fail signal which can be used by a microprocessor or microcomputer to interrupt the processor and vector the processor to a power fail service routine and it will be understood that the FET voltage level detecting circuit can be used in conjunction with circuits other than microcomputers or microprocessors.

What is claimed is:

1. A field effect transistor voltage level detecting circuit comprising: a depletion type transistor having a first and a second electrode and a control electrode, the first electrode being coupled to a first voltage terminal and the control electrode being coupled to a second voltage terminal; a first enhancement type transistor having a first and a second electrode and a control electrode, the first electrode of the first enhancement type transistor being coupled to the second electrode of the depletion type transistor, the control electrode of the first enhancement type transistor being coupled to the first electrode of the first enhancement type transistor; a second enhancement type transistor having a first electrode and a control electrode coupled together to the second electrode of the first enhancement type transistor and having a second electrode coupled to the second voltage terminal; a plurality of resistances connected in series to form a voltage divider network; and at least one comparator having a first and a second input and an output, the first input being coupled to the second electrode of the depletion type transistor and the second input being coupled to the voltage divider network.

2. The voltage level detector of claim 1 wherein each of the plurality of resistances is formed by a field effect transistor.

3. The voltage level detector of claim 1 wherein the output of the at least one comparator is coupled to a voltage level shifter.

4. A voltage level detector having field effect transistors and being capable of being made as a monolithic integrated circuit, comprising: a constant voltage reference generator having at least three field effect transistors connected in series wherein the first transistor is a depletion device and the second and third transistors are enhancement devices having their gate electrodes connected to their drain electrodes, the first transistor having its gate electrode coupled to a power supply terminal, an output of the constant voltage reference generator being provided by a junction formed by the first and second transistors; a power supply voltage sensor having a plurality of resistance means coupled in series between power supply terminals; and a first voltage comparator having a first and a second input and an output, the first input being coupled to the output of the constant voltage reference generator and the second input being coupled to the power supply voltage sensor, the comparator providing an output when the power supply voltage reaches a predetermined level.

5. The voltage level detector of claim 4 further including a second voltage comparator having a first and a second input, the first input being coupled to the output of the constant voltage reference generator and the second input being coupled to the power supply voltage sensor at a point to provide a voltage lower in magnitude than provided to the second input of the first voltage comparator.

6. The voltage level detector of claim 5 further including a third voltage comparator having a first and a second input, the first input being coupled to the output of the constant voltage reference generator and the second input being coupled to the power supply voltage sensor at a point to provide a voltage lower in magnitude than provided to the second input of the second voltage comparator so that the first comparator can provide an output indicative of when the power supply reaches a first desired voltage in a power up situation, and the second comparator can provide an output indicative of when the power supply reaches a first predetermined voltage level in a power down situation, and the third comparator can provide an output indicative of when the power supply reaches a second predetermined voltage level in a power down situation, whereby the outputs of the first, second and third comparators are useful in a digital data system to signal when the power supply has reached a safe system operating level and to signal when the power supply voltage is decreasing to a level requiring safeguards to be taken in order to protect critical digital data.

7. The voltage level detector of claim 5 wherein each of the plurality of resistance means is a depletion type field effect transistor with its gate connected to its source, and all the transistors being in series to form the power supply voltage sensor.

8. A voltage reference having an output for providing a constant voltage, the voltage reference being for coupling between first and second terminals of a power source, and comprising: a depletion type field effect transistor having a gate electrode coupled to the second terminal of the power source; and a first and second enhancement type field effect transistors each having its gate electrode connected to its drain electrode, the depletion type and the first and second enhancement type transistors all being connected in series between the first and second terminals of the power source, the output of the voltage reference being provided at a junction between the depletion type and the second enhancement type transistor and having the relationship:

$$V_{REF} = \frac{\left(\sqrt{\frac{K_{20}}{K_{22}}} + \sqrt{\frac{K_{20}}{K_{21}}}\right)|V_{TD}| + 2V_{TE} + \Delta V_{SB}}{1 + \sqrt{\frac{K_{20}}{K_{22}}} + \sqrt{\frac{K_{20}}{K_{21}}}}$$

where $|V_{TD}|$ is the absolute value of threshold voltage of the depletion type transistor; $V_{TE}$ is the threshold voltage of the first and second enhancement type transistors; $\Delta V_{SB}$ is the threshold voltage increase due to substrate bias of the second enhancement type transistor; $K_{20}$, $K_{21}$ and $K_{22}$ are constants of the depletion type transistor and the first and second enhancement type transistors respectfully, the constant (K) being equal to the transistor width divided by the transistor length.

9. The voltage level reference of claim 8 further including a power source voltage sensor in parallel with the depletion type transistor and the first and second enhancement type transistors, the power source voltage sensor including a first and a second depletion type transistor in series having their gate electrodes connected to their source electrodes, and an enhancement type transistor coupled in parallel with the second depletion type transistor.

10. A voltage reference providing a reference level substantially independent of power supply variations, the voltage reference having a first and a second node for connection to a power supply, comprising: a depletion type transistor having a first and a second electrode and a control electrode, the first electrode being coupled to the first node and the control electrode being coupled to the second node; and a first enhancement type transistor having a first and a second electrode and a control electrode, the first electrode of the first enhancement type transistor being coupled to the second electrode of the depletion type transistor, the control electrode of the first enhancement type transistor being coupled to the first electrode of the first enhancement type transistor and the second electrode of the first enhancement type transistor being coupled to the second node.

11. The voltage reference of claim 10 further including a second enhancement type transistor coupled between the first enhancement type transistor and the second node wherein the second enhancement type transistor has a first electrode and a control electrode coupled together to the second electrode of the first enhancement type transistor and has a second electrode coupled to the second node.

* * * * *